(12) United States Patent
Edelstein et al.

(10) Patent No.: US 9,324,650 B2
(45) Date of Patent: Apr. 26, 2016

(54) INTERCONNECT STRUCTURES WITH FULLY ALIGNED VIAS

(71) Applicant: International Business Machines Corporation, Armonk, NY (US)

(72) Inventors: Daniel C. Edelstein, White Plains, NY (US); Nicholas C. Fuller, North Hills, NY (US); Elbert E. Huang, Carmel, NY (US); Satyanarayana V. Nitta, Cross River, NY (US); David L. Rath, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/460,435

(22) Filed: Aug. 15, 2014

(65) Prior Publication Data

US 2016/0049364 A1    Feb. 18, 2016

(51) Int. Cl.
| H01L 23/535 | (2006.01) |
| H01L 21/283 | (2006.01) |
| H01L 23/522 | (2006.01) |
| H01L 23/528 | (2006.01) |
| H01L 21/768 | (2006.01) |
| H01L 21/033 | (2006.01) |
| H01L 21/02 | (2006.01) |

(52) U.S. Cl.
CPC ........ *H01L 23/5226* (2013.01); *H01L 21/0217* (2013.01); *H01L 21/0332* (2013.01); *H01L 21/76805* (2013.01); *H01L 21/76829* (2013.01); *H01L 21/76877* (2013.01); *H01L 23/528* (2013.01)

(58) Field of Classification Search
CPC ...................... H01L 23/5226; H01L 21/76897; H01L 21/76832
See application file for complete search history.

(56) References Cited

U.S. PATENT DOCUMENTS

| 5,888,897 | A | * | 3/1999 | Liang ................. H01L 21/76807 |
| | | | | 257/E21.507 |
| 5,985,746 | A | | 11/1999 | Kapoor |
| 6,127,263 | A | * | 10/2000 | Parikh .............. H01L 21/76811 |
| | | | | 257/E21.579 |
| 6,245,657 | B1 | | 6/2001 | Chu et al. |
| 6,372,641 | B1 | | 4/2002 | Lien |
| 6,548,905 | B2 | | 4/2003 | Park et al. |
| 6,884,710 | B2 | | 4/2005 | Park et al. |
| 7,470,616 | B1 | * | 12/2008 | Akinmade-Yusuff H01L 21/76802 |
| | | | | 257/E23.145 |
| 7,696,085 | B2 | | 4/2010 | Li et al. |
| 8,299,625 | B2 | | 10/2012 | Ponoth et al. |
| 8,390,130 | B1 | | 3/2013 | Hiner et al. |
| 8,470,685 | B2 | | 6/2013 | Torres et al. |
| 8,519,540 | B2 | | 8/2013 | Chen et al. |

(Continued)

*Primary Examiner* — Bradley K Smith
*Assistant Examiner* — David Goodwin
(74) *Attorney, Agent, or Firm* — David Zwick; Louis J. Percello

(57) ABSTRACT

A method of forming a fully aligned via connecting two metal lines on different Mx levels by forming a recessed opening above a first metal line in a first ILD; forming a cap on the first ILD and in the recessed openings; forming a second ILD on the cap; forming a metal trench hardmask above the second ILD, forming a metal trench pattern in the metal trench hardmask; forming a via pattern that is self aligned to the metal trench pattern and above a portion of the first metal line; forming a via opening exposing the first metal line by transferring the via pattern and metal trench pattern to lower levels, the via pattern is self-aligned to the recessed opening; and forming a via and a third metal line in the via opening and the transferred metal trench pattern, respectively.

7 Claims, 7 Drawing Sheets

(56) References Cited

U.S. PATENT DOCUMENTS

| | | | |
|---|---|---|---|
| 2003/0089987 A1* | 5/2003 | Parikh | H01L 21/7681 257/758 |
| 2006/0205204 A1* | 9/2006 | Beck | H01L 21/7684 438/628 |
| 2009/0200683 A1 | 8/2009 | Colburn et al. | |
| 2013/0328208 A1* | 12/2013 | Holmes | H01L 21/76883 257/774 |
| 2014/0117558 A1* | 5/2014 | Boyanov | H01L 21/76883 257/774 |
| 2015/0171010 A1* | 6/2015 | Bristol | H01L 23/522 257/774 |

* cited by examiner

INTERCONNECT STRUCTURES WITH FULLY ALIGNED VIAS

BACKGROUND

The present invention generally relates to semiconductor device manufacturing, and more particularly to fabricating a metal line interconnect (via) fully aligned to both a $M_x$ level and a $M_{x+1}$ level.

The fabrication of Very-Large Scale Integrated (VLSI) or Ultra-Large Scale Integrated circuits (ULSI) requires an interconnect structure including metallic wiring that connects individual devices in a semiconductor chip, to one another. Typically, the wiring interconnect network consists of two types of features that serve as electrical conductors: line features that traverse a distance across the chip, and via features which connect lines in different levels. Typically, the conducting metal lines and vias are comprised of aluminum or copper and are insulated by the interlayer dielectrics (ILD) which are electrical insulators.

In order to improve performance, the semiconductor industry has shrunk the gate length and, as a result, the chip size. As a consequence the interconnect structure that forms the metallic circuitry has also shrunk.

Traditionally, the via levels are one of the most challenging to print with a high process latitude. In order to improve the manufacturability of the lithography step, advanced masks that incorporate phase-shifting and optical proximity correction have been employed. In addition, as the size scale of these interconnects decrease, there is growing concern that overlay error between features in the interconnect structure may lead to reliability issues. Overlay errors result from misalignment during the lithography process as the mask invariably may not be perfectly aligned to the underlying structure. Although overlay errors can be minimized by reworking the lithography, some level of overlay error is unavoidable.

Two key failure modes for interconnects, that may be dependent on overlay error of lithographic patterns, are electromigration (EM) and time dependent dielectric breakdown (TDDB). This is of critical importance, as devices must be fabricated in a manner that enables their function over useful lifetimes and in various environments.

Electromigration failure results when a void forms in the conducting metal feature through metal diffusion leading to a short (or very high resistance) in the circuitry. The mechanism of electromigration is highly dependent upon the current density and the cross section of the metal features. If the wiring is constructed such that the intersection between the via and line is too small, smaller voids formed by electromigration can lead to failure which shortens the electromigration lifetime.

Time dependent dielectric breakdown (TDDB) is a failure mode whereby the insulating materials (or layers) no longer serve as adequate electrical insulators resulting in unintended conductance between two adjacent metal features. This phenomenon is highly dependent upon the electrical field between the metal features as regions with higher electrical fields are more susceptible to TDDB failure. Consequently, it is critical to control the spacing between conducting metal features in order to maintain electrical fields to tolerable levels.

SUMMARY

According to one embodiment of the present invention, a method of forming a fully aligned via to a first metal line and a third metal line is provided. The method may include forming a first metal line and a second metal line in a first inter-level dielectric (ILD); forming a first recessed opening by recessing the first metal line below a top surface of the first ILD; forming a cap on the first ILD and in the first recessed opening; forming a second ILD on the cap; forming a higher level hardmask on the second ILD; forming a metal trench hardmask on the higher level hardmask; forming a metal trench pattern in the metal trench hardmask, wherein a portion of the metal trench pattern is above a portion of the first recessed opening; forming a via pattern material on the metal trench hardmask and in the metal trench pattern; forming a first via pattern in the via pattern material, the first via pattern is located above a portion of the metal trench pattern and above the portion of the first recessed opening, wherein the first via pattern is self aligned to the metal trench pattern; removing the via pattern material; forming a first higher level trench in the higher level hardmask and in the second ILD, wherein the first higher level trench includes a first via opening, wherein the first via opening is the first via pattern transferred to a lower level; and forming a third metal line and a first via in the first higher level trench and in the first via opening, respectively, wherein the via connects the first metal line to the third metal line.

According to another embodiment, a method of forming a fully aligned via to a first metal line and a third metal line is provided. The method may include recessing a first metal line and a second metal line, wherein the first metal line and the second metal line are in a first ILD; forming a cap on the first ILD and on the first and second metal lines; forming a second ILD on the cap; forming a metal trench hardmask above the second ILD and metal trench pattern in the second ILD; forming a via pattern in the second ILD, the via pattern is formed at a vertical intersection of the metal trench pattern and the first metal line, wherein the via pattern is self-aligned to the metal trench pattern; forming a higher level trench in the second ILD, wherein the higher level trench includes a via opening, wherein the via opening is the via pattern transferred to a lower level; and forming a third metal line and a via in the higher level trench and in the via opening, respectively, wherein the via connects the first metal line to the third metal line.

According to another embodiment, a structure of a fully aligned via is provided. The structure may include a first metal line and a second metal line in a first ILD; a cap covering the first ILD, the second metal line, and a portion of the first metal line; a second ILD on the cap; and a via that electrically connects the first metal line to a third metal line, wherein the third metal line is above the first metal line and runs perpendicular to the first metal line, the via is fully aligned to the first metal line and the third metal line, and the via electrically connects the first metal line to the third metal line.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
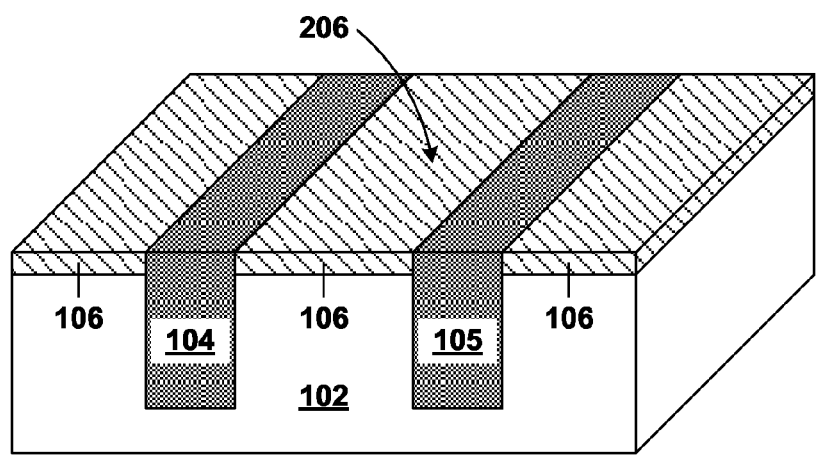
FIG. 1 is an isometric view of a semiconductor structure according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element may be etched and the second element may act as an etch stop.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to fabricating a metal line interconnect (via) fully aligned to both a $M_x$ level and a $M_{x+1}$ level. Ideally, it may be desirable to fabricate a via with a specific amount of surface contact and with no overlap. One way to fabricate a fully aligned via is described in detail below by referring to the accompanying drawings FIGS. 1-11.

FIG. 1 is a demonstrative illustration of a structure 100 during an intermediate step of a method of fabricating a fully aligned via according to an exemplary embodiment. More specifically, the method can start with fabricating a first metal line 104 and a second metal line 105 in a first interlayer dielectric (hereinafter "first ILD") 102.

The first ILD 102 may include any materials known in the art, such as, for example, porous silicates, carbon doped oxides, silicon dioxides, silicon nitrides, silicon oxynitrides, or other dielectric materials. The first ILD 102 may be formed using any method known in the art, such as, for example, chemical vapor deposition, plasma enhanced chemical vapor deposition, atomic layer deposition, or physical vapor deposition. The first ILD 102 may have a thickness ranging from about 25 nm to about 200 nm.

A trench stop hardmask 106 may include any masking material known in the art, such as, for example, a low-k silicon carbide (SiC) or silicon carbonitride (SiCN). The trench stop hardmask 106 may be formed on the first ILD 102 and may be formed using any method known in the art, such as, for example, chemical vapor deposition, plasma enhanced chemical vapor deposition, atomic layer deposition, or physical vapor deposition. The trench stop hardmask 106 may have a thickness ranging from about 1 nm to 50 nm. Metal openings may be formed in the trench stop hardmask 106 and in the first ILD 102 using any technique known in the art, such as, for example, wet or dry etching. The trench stop hardmask 106 may have a trench stop hardmask surface 206, and the trench stop hardmask surface 206 may be a top surface of the trench stop hardmask 106.

The first and second metal lines 104, 105 (associated with Mx layer) may be formed in the metal openings. The first and second metal lines 104, 105 may be any conductive materials known in the art, such as, for example, copper (Cu), aluminum (Al), or tungsten (W). The first and second metal lines 104, 105 may be fabricated using any technique known in the art, such as, for example, a single or dual damascene technique. In an embodiment, not illustrated, the first and second metal lines 104, 105 may be copper (Cu) and may include a metal liner, where the metal liner may be metals, such as, for example, tantalum nitride and tantalum (TaN/Ta), titanium, titanium nitride, cobalt, ruthenium, and manganese.

Figure 2:
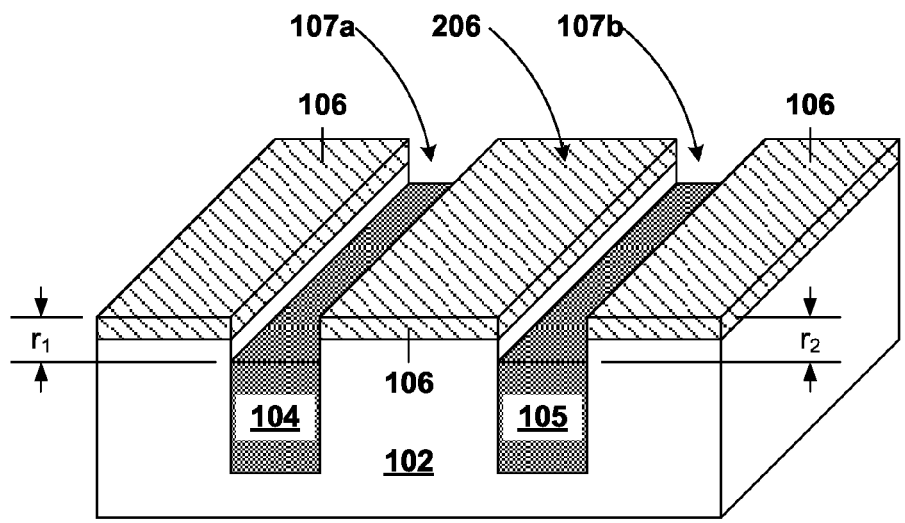
FIG. 2 illustrates a recessed metal line according to an exemplary embodiment.

FIG. 2 is a demonstrative illustration of a structure 100 during an intermediate step of a method of fabricating a fully aligned via according to the first embodiment. More specifically, the method may include forming a first recessed opening 107a and a second recessed opening 107b above the first and second metal lines 104, 105.

The first and second recessed openings 107a, 107b may be formed by etching the first and second metal lines 104, 105 using any etching technique known in the art, such as, for example, a reactive ion etching (RIE) technique and/or wet etches. This may include NF3, Cl2, BCl3, Ar, (may add more here) based plasmas chemistries. Alternatively, wet chemistries may be employed to recess the metal lines 104, 105. Including acidic chemistries having an oxidizer, e.g., hydrogen peroxide. Furthermore, the metal lines recess can be performed in a manner where the bulk of the conducting line (e.g., Cu or W) may be removed in a separate step from the metal barrier liner which may be comprised of Ti, TiN, Ta, TaN, Co, Ru, Mn, etc. The first recessed opening 107a may be formed at the same time as the second recessed opening 107b. The first and second recessed openings 107a, 107b may be formed by etching the first and second metal lines 104, 105 selective to the trench stop hardmask 106, where the first and second metal lines 104, 105 may be etched and the trench stop hardmask 106 may act as an etch stop. The first and second recessed openings 107a, 107b may be formed with a first and second recessed depth ($r_1$, $r_2$), respectively. The first recessed depth ($r_1$) may be the same as the second depth ($r_2$). The first and second depth ($r_1$, $r_2$) may range from about 5 nm to 50 nm. The first and second recessed depth ($r_1$, $r_2$) may be a distance from the trench stop hardmask surface 206 to a top surface of the first and second metal lines 104, 105, respectively.

Figure 3A:
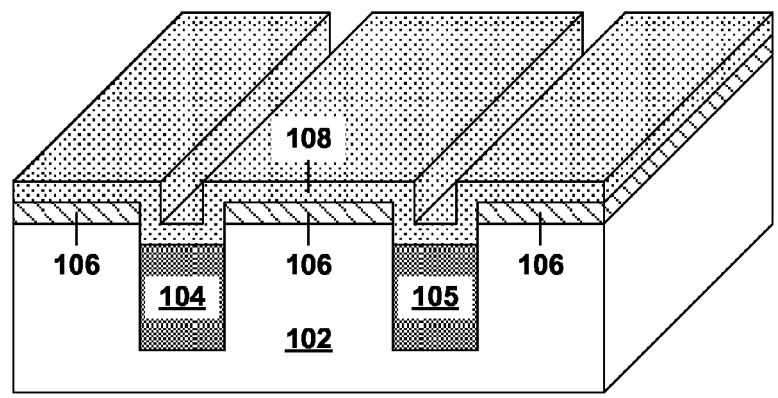
FIGS. 3a-3c illustrate the formation of a cap on the structure according to an exemplary embodiment.
Figure 3B:
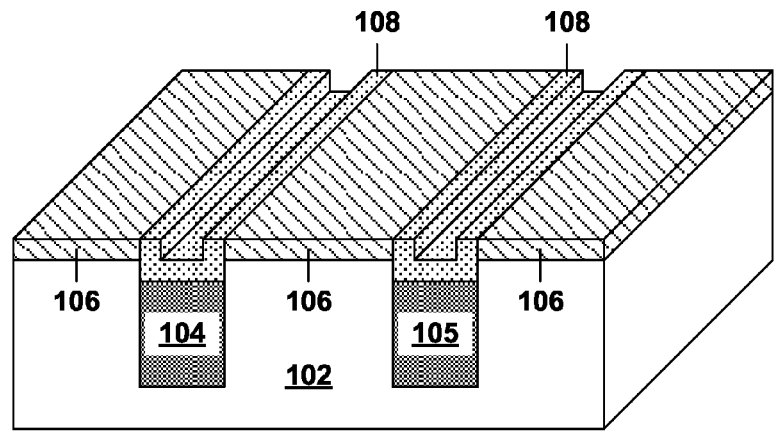
Figure 3C:
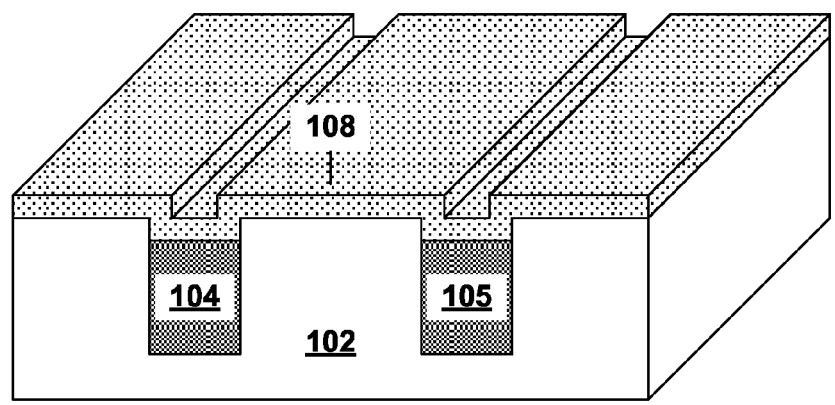

FIGS. 3a-3c are demonstrative illustrations of a structure 100 during an intermediate step of a method of fabricating a fully aligned via according to an exemplary embodiment. More specifically, the method may include forming a cap 108 on the structure 100.

In the present embodiment, illustrated as FIG. 3a, the cap 108 may be deposited directly on top of the trench stop hardmask 106 and directly on top of the first and second metal lines 104, 105. The cap 108 may include any suitable dielectric material, such as, for example, silicon nitride ($Si_3N_4$), silicon carbide (SiC), silicon carbonitride (SiCN), hydrogenated silicon carbide (SiCH), or any other material known in the art. The cap 108 may be formed using any technique known in the art, such as, for example, chemical vapor deposition, plasma enhanced chemical vapor deposition, atomic layer deposition, or physical vapor deposition. The cap 108 may have a thickness ranging from about 10 nm to about 55 nm. The cap 108 may act as an air or metal diffusion barrier or insulator and may be used to improve interconnect reliability.

In another embodiment, illustrated as FIG. 3b, the cap 108 may be polished such that the cap 108 is removed from portions above the trench stop hardmask 106 but remains above the first and second metal lines 104, 105. In yet another embodiment, illustrated as FIG. 3c, the trench stop hardmask 106 may not be used and the cap 108 may be deposited directly on the first ILD 102.

Figure 4:
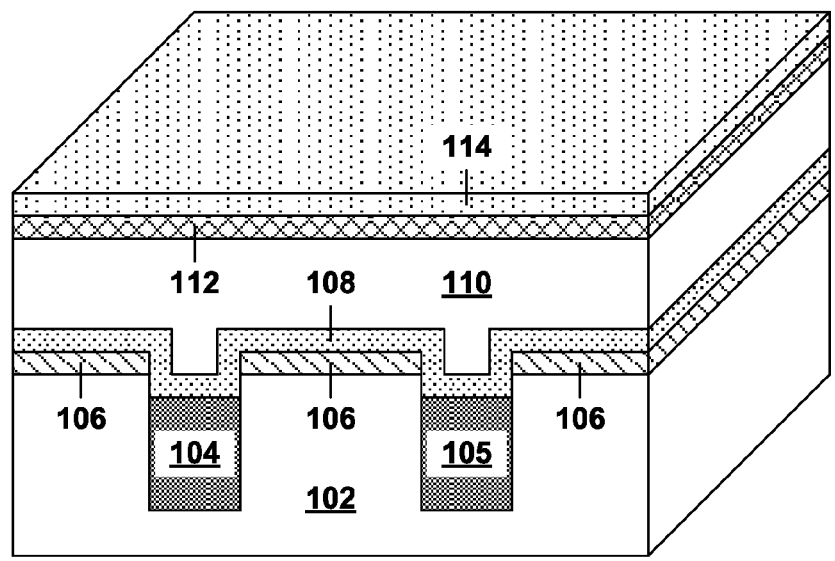
FIG. 4 illustrates the formation of two hardmask layers and a second ILD layer on the structure according to an exemplary embodiment.

FIG. 4 is a demonstrative illustration of a structure 100 during an intermediate step of a method of fabricating a fully aligned via according to an exemplary embodiment. More specifically, the method may include forming a second ILD 110, a higher level hardmask 112, and a metal trench hardmask 114 on the structure 100. It should be noted that the illustrated embodiments include the cap 108 covering the trench stop hardmask 106 and the first and second metal lines 104, 105 as illustrated in FIG. 3a.

The second ILD 110 may be any material known in the art and may be substantially similar to the first ILD 102 described above. The second ILD 110 may be formed using any technique known in the art, such as, for example, plasma enhanced chemical vapor deposition (PECVD). The second ILD 110 may be formed on the cap 108. The second ILD 110 may be planarized to provide a top surface for subsequent material deposition. The optional planarization process may involve chemical mechanical polishing (CMP).

The higher level hardmask 112 may be any masking material known in the art and may be substantially similar to the trench stop hardmask 106 described above. The higher level hardmask 112 may be formed on the second ILD 110.

The metal trench hardmask 114 may be any masking material known in the art, such as, for example, titanium nitride (TiN). The metal trench hardmask 114 may be formed on the higher level hardmask 112. The metal trench hardmask 114 may be a different material from the higher level hardmask 112 to allow for subsequent etching of the metal trench hardmask 114 selective to the higher level hardmask 112, where the metal trench hardmask 114 can be etched and the higher level hardmask 112 can act as an etch stop.

Figure 5:
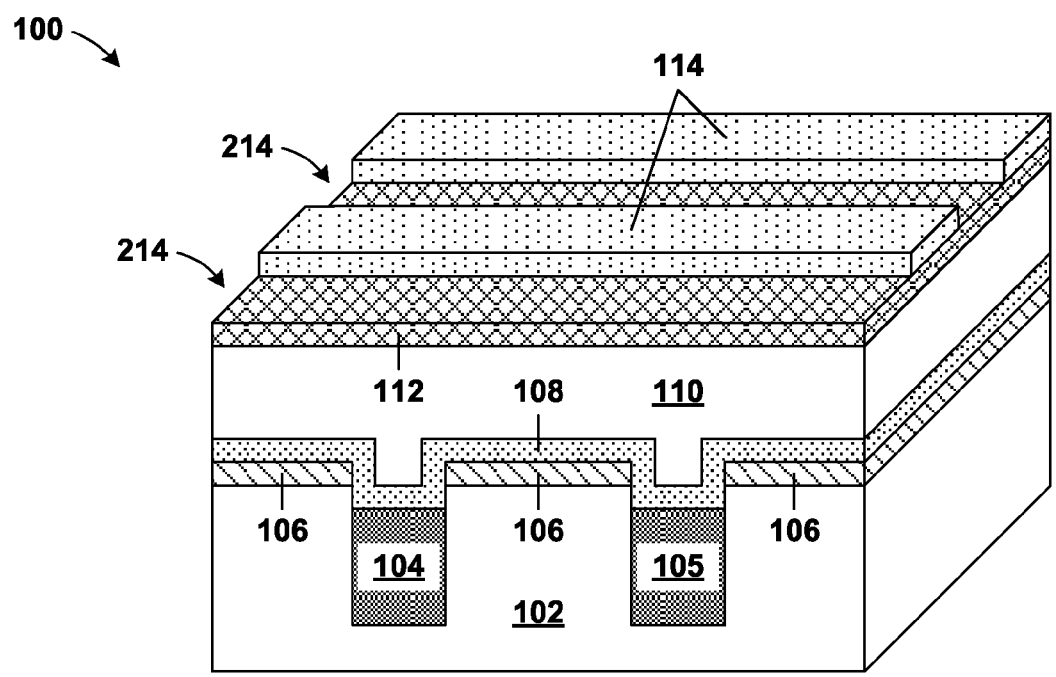
FIG. 5 illustrates the formation of a metal trench pattern according to an exemplary embodiment.

FIG. 5 is a demonstrative illustration of a structure 100 during an intermediate step of a method of fabricating a fully aligned via according to an exemplary embodiment. More specifically, the method may include etching a metal trench pattern 214 in the metal trench hardmask 114.

The metal trench pattern 214 may be formed using any etching technique known in the art, such as, for example, reactive ion etch (RIE). In an embodiment, the higher level hardmask 112 may act as an etch stop for the formation of the metal trench pattern 214, and portions of the metal trench hardmask 114 may be removed selective to the higher level hardmask 112 to form the metal trench pattern 214. In general, the metal trench pattern 214 may run perpendicular to, and overlap at least a portion of, the first and second metal lines 104, 105, as illustrated.

Figure 6:
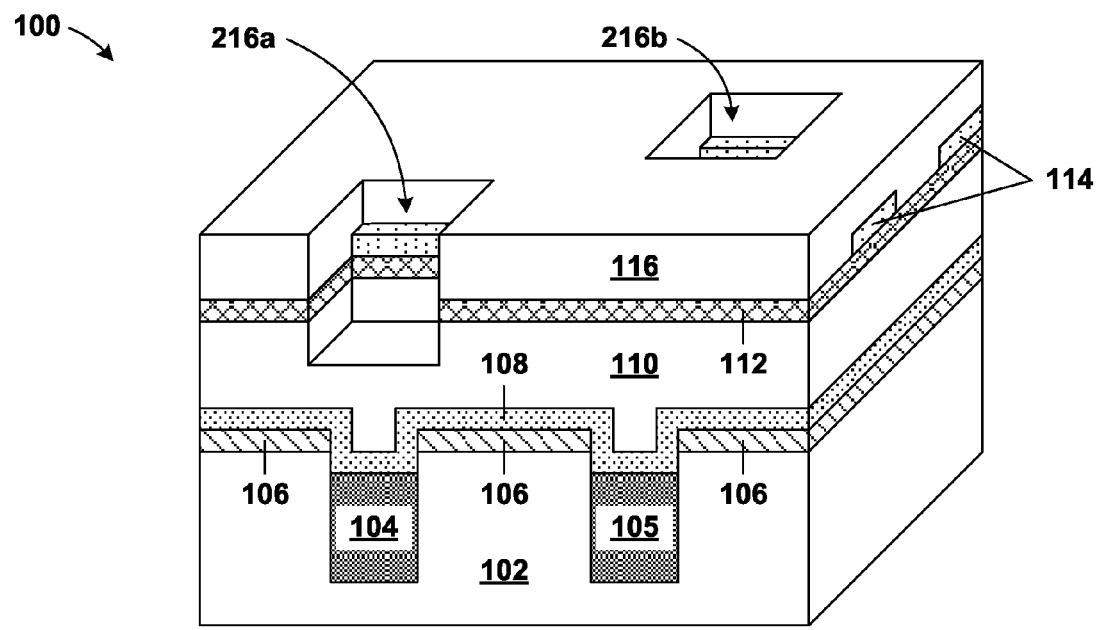
FIG. 6 illustrates the formation of a partial via pattern according to an exemplary embodiment.
Figure 7:
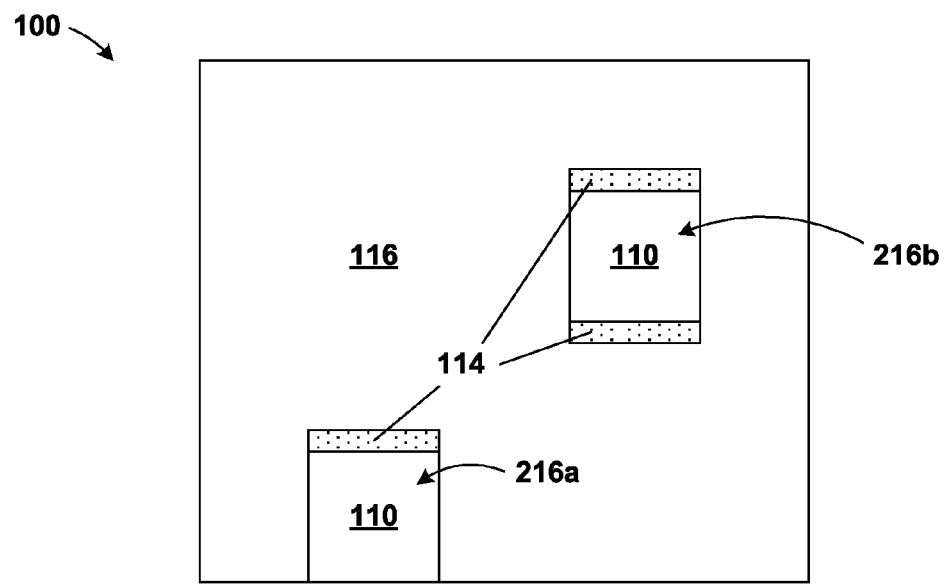
FIG. 7 is a top view of the structure illustrated in FIG. 6.

FIGS. 6 and 7 are a demonstrative illustration of a structure 100 during an intermediate step of a method of fabricating a fully aligned via according to an exemplary embodiment. More specifically, the method may include forming a via pattern material 116 and etching a first via pattern 216a and a second via pattern 216b. The structure 100 illustrated in FIG. 7 is a top view of the structure 100 illustrated in FIG. 6.

The via pattern material 116 may include any masking materials that are commonly used in lithography known in the art, such as, for example, organic resist coatings or patterning layers. The via pattern material 116 may be formed on the structure 100 by spin coating and may be comprised of multiple layers. The via pattern material 116 may have a thickness ranging from about 5 nm to 500 nm.

Ideally, a via pattern will be aligned to a lower metal line through alignment of lithography techniques, however, some level of misalignment invariably occurs and as device dimensions shrink with technology, this misalignment or overlay errors become more impactful. Consequently, the self-alignment of a via to the lower and higher metal lines may become necessary.

The first and second via patterns 216a, 216b may be any shape, such as, for example, a square, a rectangle, or a circle. In general, the first via pattern 216a may be defined such that it is placed in a direction that intersects both the metal trench pattern 214 (illustrated in FIG. 5) and the first metal line 104. In general, the second via pattern 216b may be defined to a desired location such that it is etched in a direction that intersects both the metal trench pattern 214 and the second metal line 105. The first and second via patterns 216a, 216b may be misaligned relative to the desired location of the higher line but may be self-aligned by the metal trench hardmask 114 because of the selectivity of the etching technique, where forming the first and second via patterns 216a, 216b by etching the via pattern material 116 is selective to the metal trench hardmask 114. The first and second via patterns 216a, 216b may be formed by any etching technique known in the art, such as, for example, reactive ion etch.

With further reference to FIGS. 6 and 7, the first and second via patterns 216a, 216b may each overlap a portion of the metal trench pattern 214. The first and second via patterns 216a, 216b may overlap the metal trench hardmask 114 on two sides of each of the first and second via patterns 216a, 216b. The overlap of the first and second via patterns 216a, 216b to the metal trench hardmask 114 may cause the first and second via patterns 216a, 216b to self-align to the metal trench pattern 214, as illustrated. The self-alignment of the first and second via patterns 216a, 216b may be formed because of the selectivity of the etching technique, where forming the first and second via patterns 216a, 216b by etching the via pattern material 116 is selective to the metal trench hardmask 114.

In the exemplary embodiment, the first and second via patterns 216a, 216b may be formed through the higher level hardmask 112 and partially through the second ILD 110. In an alternative embodiment, the first and second via patterns 216a, 216b may be formed through both the higher level hardmask 112 and the second ILD 110. In yet another embodiment, the first and second via patterns 216a, 216b may be formed partially through the higher level hardmask 112 and not reach the second ILD 110. A depth of the first and second via patterns 216a, 216b may be a function of etch selectivity of the materials used or a first or second desired via depth, respectively.

Figure 8:
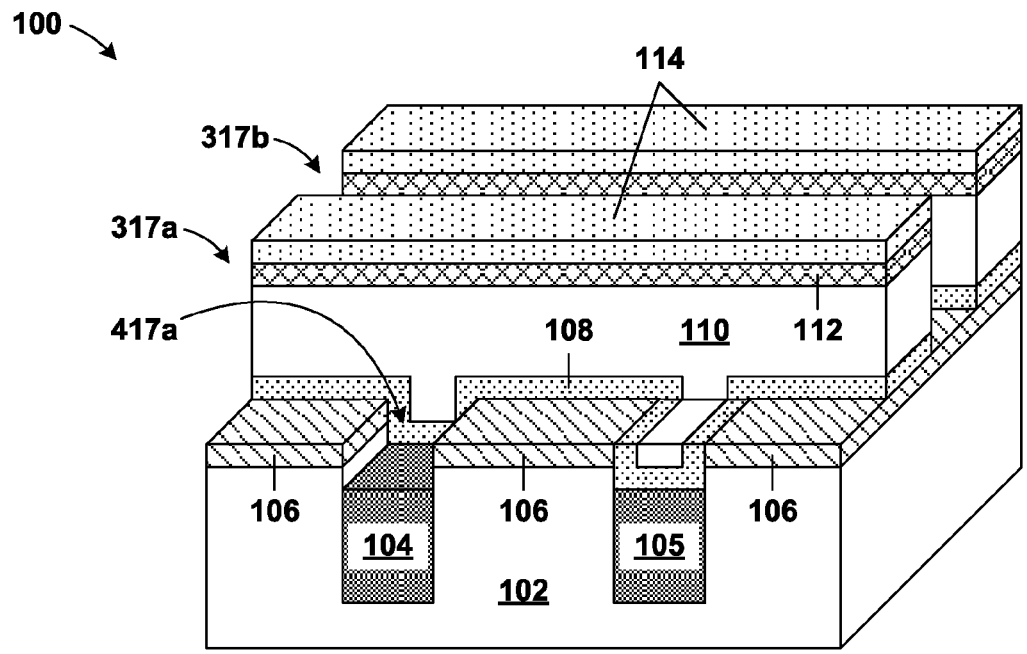
FIG. 8 illustrates the formation of a higher level trench according to an exemplary embodiment.
Figure 9:
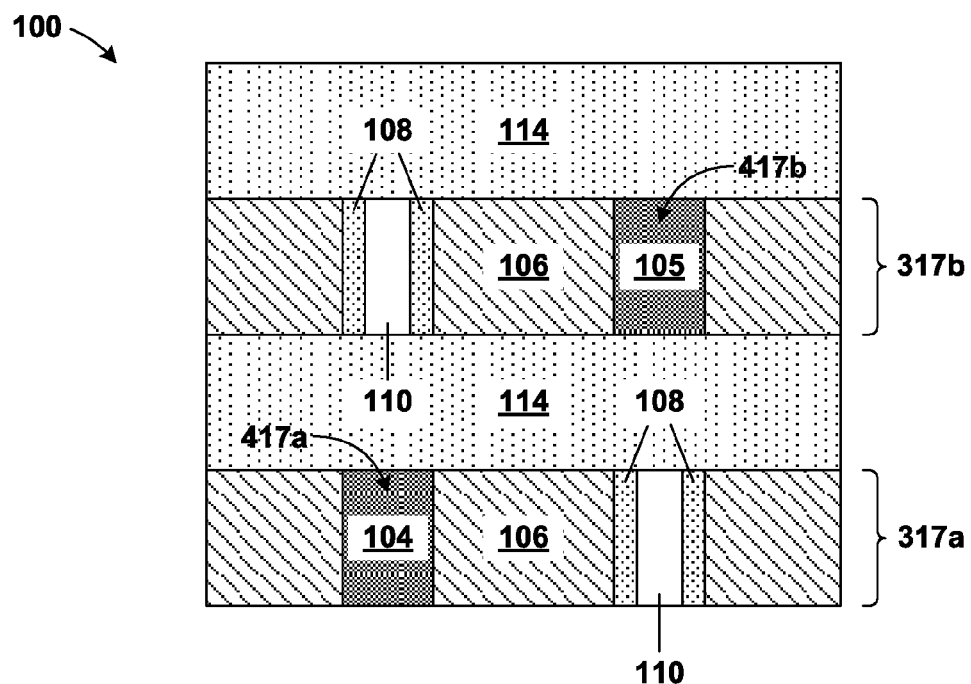
FIG. 9 is a top view of the structure illustrated in FIG. 8

FIGS. 8 and 9 are demonstrative illustrations of a structure 100 during an intermediate step of a method of fabricating a fully aligned via according to an exemplary embodiment. More specifically, the method may include removing the via pattern material 116 and etching a first higher level trench 317a and a second higher level trench 317b. The structure 100 illustrated in FIG. 9 is a top view of the structure 100 illustrated in FIG. 8.

The via pattern material 116 may be removed using any method known in the art, such as, for example, reactive ion etch or strip. The first and second higher level trenches 317a, 317b are formed from the metal trench pattern 214 (illustrated in FIG. 5). The relative depths of the first and second via patterns 216a, 216b may be carried into the first and second via openings 417a, 417b, respectively. The first and second higher level trenches 317a, 317b may be etched using any etching technique known in the art, such as, for example, reactive ion etch. The etching technique of the first and second higher level trenches 317a, 317b may be etch selective to the metal trench hardmask 114 and the trench stop hardmask 106, where the second ILD 110 may be etched and the metal trench hardmask 114 and the trench stop hardmask 106 may act as an etch stop. The etch selectivity of the second ILD 110 to the trench stop hardmask 106 may allow for self-alignment of a first via opening 417a and a second via opening 417b to the trench stop hardmask 106. The first and second via openings 417a, 417b may be formed during formation of the first and second higher level trenches 317a and 317b. The first and second via openings 417a, 417b may be formed in a portion of the first and second recessed openings 107a, 107b (illustrated in FIG. 2). In the exemplary embodiment the first via opening 417a represents a portion of the first recessed opening 107a above the first metal line 104. In the exemplary embodiment the second via opening 417b represents a portion of the second recessed opening 107b above the second metal line 105. The first and second via openings 417a, 417b may be self-aligned to both the metal trench hardmask 114 and the trench stop hardmask 106.

Figure 10:
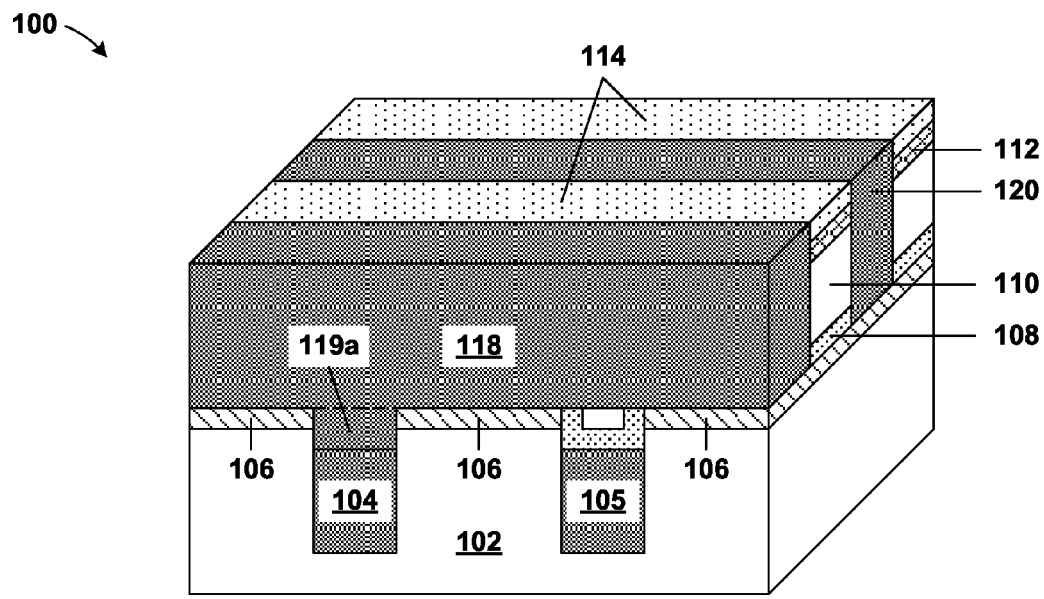
FIG. 10 illustrates the formation of a third and fourth metal line and a via in the trench according to an exemplary embodiment.
Figure 11:
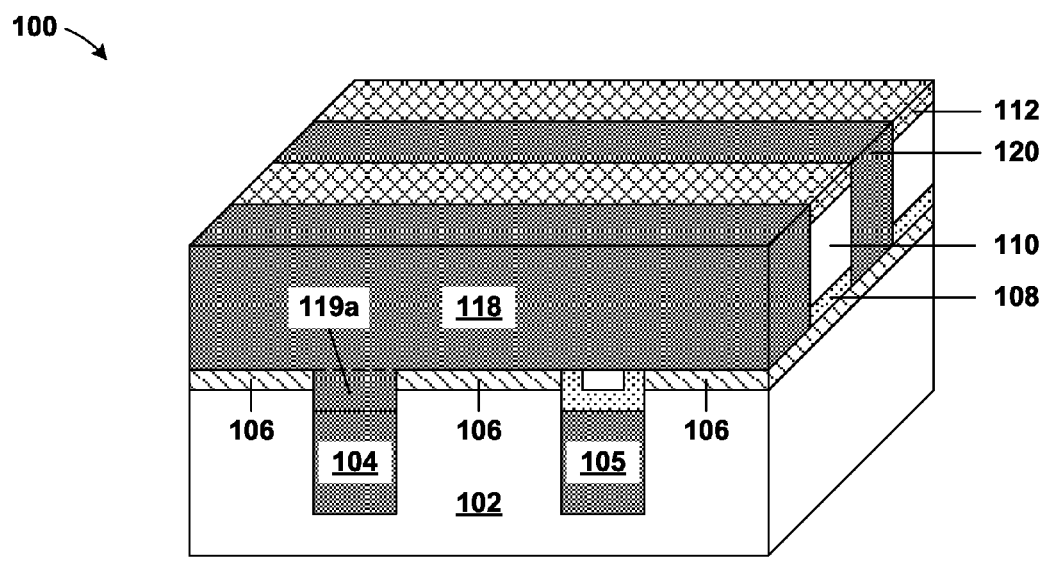
FIG. 11 illustrates the polishing of the structure according to an exemplary embodiment.

FIGS. 10 and 11 are demonstrative illustrations of a structure 100 during an intermediate step of a method of fabricating fully aligned via according to an exemplary embodiment. More specifically, the method may include depositing a third metal line 118 and a forth metal line 120 in the first and second higher level trenches 317a, 317b, respectively.

The first and second metal lines 104, 105, may be different or substantially similar materials compared to the third and forth metal lines 118, 120, or any variation therein. The first and second metal lines 104, 105 and the third and fourth metal lines 118, 120 may be any conductive materials, such as, for example, copper (Cu), aluminum (Al), or tungsten (W). In an embodiment, the third and fourth metal lines 118, 120 may be copper (Cu) and may include a metal liner, where the metal liner may be a tantalum nitride/tantalum (TaN/Ta) combination. The first and second, metal lines 104, 105 may be fabricated using any technique known in the art, such as, for example, a single or dual damascene techniques. The third and fourth metal lines 118, 120 may be fabricated using a dual damascene technique. In the exemplary embodiment, the third metal line 118 may be formed in the first higher level trench 317a and in the first via opening 417a, and may reach the first metal line 104. In the exemplary embodiment, the fourth metal line 120 may be formed in the second higher level trench 317b and in the second via opening 417b, and may reach the second metal line 105. The structure may be polished to a top surface of the metal trench hardmask 114 (illustrated in FIG. 10), polished to a top surface of the higher level hardmask 112 (illustrated in FIG. 11), or any other surface.

A first via (interconnect) 119a and second via (not shown in the illustration) may be formed at the same time and of the same material as the third and fourth metal line 118, 120. The first via 119a may connect the first metal line 104 to the third metal line 118. The second via may connect the second metal line 105 to the fourth metal line 120. The self-alignment of the first and second via patterns 216a, 216b to the metal trench pattern 214 and the self-alignment of the first and second higher level trenches 317a, 317b to the trench stop hardmask 106 may produce a first via 119a and second via that are fully aligned, where the first via 119a is fully aligned to the first and third metal lines 104, 118 and the second via is fully aligned to the second and fourth metal line 105, 120.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a semiconductor structure comprising:
    forming a first metal line and a second metal line in a first inter-level dielectric (ILD);
    forming a first recessed opening by recessing the first metal line below a top surface of the first ILD;
    forming a cap on the first ILD and in the first recessed opening;
    forming a second ILD on the cap;
    forming a higher level hardmask on the second ILD;
    forming a metal trench hardmask on the higher level hardmask;

forming a metal trench pattern in the metal trench hardmask, wherein a portion of the metal trench pattern is above a portion of the first recessed opening;

forming a via pattern material on the metal trench hardmask and in the metal trench pattern;

forming a first via pattern in the via pattern material, the first via pattern is located above a portion of the metal trench pattern and above the portion of the first recessed opening, wherein the first via pattern is self aligned to the metal trench pattern;

removing the via pattern material;

forming a first higher level trench in the higher level hardmask and in the second ILD, wherein the first higher level trench includes a first via opening, wherein the first via opening is the first via pattern transferred to a lower level; and forming a third metal line and a first via in the first higher level trench and in the first via opening, respectively, wherein the via connects the first metal line to the third metal line.

2. The method of claim 1, further comprising:
forming a trench stop hardmask between the first ILD and the cap.

3. The method of claim 1, wherein the first ILD and the second ILD are the same material.

4. The method of claim 2, wherein the first via opening is formed by etching the second ILD and the cap and using the trench stop hardmask as an etch stop.

5. The method of claim 2, wherein the trench stop hardmask is a low-k silicon carbonitride with dielectric constant of 2.5-5.

6. The method of claim 1, wherein the cap is conformally formed and the cap is a silicon nitride or silicon carbonitride.

7. The method of claim 1, further comprising:
forming a second recessed opening by recessing the second metal line below the top surface of the first ILD;

forming a second via pattern in the via pattern material, the second via pattern is located above a portion of the metal trench pattern and above a portion of the second recessed opening, wherein the second via pattern is self aligned to the metal trench pattern;

forming a second higher level trench in the higher level hardmask and in the second ILD, wherein the second higher level trench includes a second via opening, wherein the second via opening is the second via pattern transferred to a lower level; and forming a forth metal line and a second via in the second higher level trench and the second via opening, respectively, wherein the second via connects the second metal line to the fourth metal line.

\* \* \* \* \*